(12) United States Patent
Koduri et al.

(10) Patent No.: US 11,894,339 B2
(45) Date of Patent: Feb. 6, 2024

(54) PROXIMITY SENSOR

(71) Applicant: TEXAS INSTRUMENTS INCORPORATED, Dallas, TX (US)

(72) Inventors: Sreenivasan Kalyani Koduri, Allen, TX (US); Leslie Edward Stark, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 463 days.

(21) Appl. No.: 17/121,198

(22) Filed: Dec. 14, 2020

(65) Prior Publication Data

US 2022/0189912 A1 Jun. 16, 2022

(51) Int. Cl.
| | |
|---|---|
| H01L 25/04 | (2023.01) |
| H01L 25/075 | (2006.01) |
| G01S 17/08 | (2006.01) |
| H01L 33/62 | (2010.01) |

(52) U.S. Cl.
CPC ............ *H01L 25/042* (2013.01); *G01S 17/08* (2013.01); *H01L 25/0753* (2013.01); *H01L 33/62* (2013.01)

(58) Field of Classification Search
CPC ............ H01L 21/0272; H01L 21/0331; H01L 21/565; H01L 33/021162; H01L 33/021164; H01L 33/0203; H01L 33/52; H01L 33/54; H01L 25/042; H01L 25/0753; H01L 25/167; H01L 2224/48137; G01S 17/08
See application file for complete search history.

(56) References Cited

U.S. PATENT DOCUMENTS

| | | | |
|---|---|---|---|
| 2006/0017148 A1* | 1/2006 | Lee | ..................... H01L 23/3135 257/E23.126 |
| 2013/0187260 A1 | 7/2013 | Kelkar et al. | |
| 2016/0043064 A1 | 2/2016 | Tran et al. | |
| 2016/0187483 A1* | 6/2016 | Luan | ..................... G01S 7/4813 250/221 |
| 2019/0154801 A1 | 5/2019 | Gani | |

OTHER PUBLICATIONS

Search Report for PCT Application No. PCT/US2021/061946, date of mailing of the international search report dated Apr. 7, 2022 (Apr. 7, 2022), 1 page.

* cited by examiner

*Primary Examiner* — Tucker J Wright
(74) *Attorney, Agent, or Firm* — Frank D. Cimino

(57) ABSTRACT

A method of manufacturing a sensor device includes obtaining a semiconductor die structure comprising a transmitter and a receiver. Then, a first sacrificial stud is affixed to the transmitter and a second sacrificial stud is affixed to the receiver. The semiconductor die is affixed to a lead frame, and pads on the semiconductor die structure are wirebonded to the lead frame. The lead frame, the semiconductor die structure, and the wirebonds are encapsulated in a molding compound, while the tops of the first and second sacrificial studs are left exposed. The first and second sacrificial studs prevent the molding compound from encapsulating the transmitter and the receiver, and are removed to expose the transmitter in a first cavity and the receiver in a second cavity. In some examples, the semiconductor die structure includes a first semiconductor die comprising the transmitter and a second semiconductor die comprising the receiver.

14 Claims, 5 Drawing Sheets

PROXIMITY SENSOR

BACKGROUND

Many proximity sensors include a transmitter and a receiver. The transmitter transmits a signal, for example an optical signal or a radar signal, and the receiver receives reflections of the transmitted signal. The time between signal transmission and receipt of the reflected signal can be used to determine the distance between the proximity sensor and the object off of which the transmitted signal was reflected. Channel isolation between the transmitter and receiver is important to achieving precise measurements. Some sensing systems also require complex calibration calibrations to determine the precise location of the transmitter and receiver relative to each other. Also, optical sensing systems require careful alignment of optical components, which can increase the size of the sensing system. Some sensing systems attempt to place the transmitter and receiver in a single package to ensure a fixed spatial relationship. However, building a transmitter and a receiver into a single sensor package is complex, and the resulting sensor package is often not as small as desired for a particular implementation.

SUMMARY

A method of manufacturing a sensor device includes obtaining a semiconductor die structure comprising a transmitter and a receiver. Then, a first sacrificial stud is affixed to the transmitter, and a second sacrificial stud is affixed to the receiver. The semiconductor structure is affixed to a lead frame, and pads on the semiconductor structure are wire-bonded to the lead frame. The lead frame, the semiconductor structure, and the wirebonds are encapsulated in a molding compound, while the tops of the first and second sacrificial studs are left exposed. The first and second sacrificial studs prevent the molding compound from encapsulating the transmitter and the receiver, and are removed to expose the transmitter in a first cavity and the receiver in a second cavity.

In some examples, the semiconductor structure comprises a single semiconductor die with both the transmitter and the receiver. In some examples, the semiconductor structure comprises two semiconductor die, a first semiconductor die comprising the transmitter and a second semiconductor die comprising the receiver. In some implementations, the first and second cavities are filled with a non-molding compound material, such as a clear plastic, lenses, and the like. For example, the transmitter comprises a light source, and the receiver comprises a light detector. The first and second cavities are filled with a transparent compound to allow light to pass through from the light source and to the light detector. The molding compound forms a barrier between the first and second cavities in some examples.

In some implementations, the first and second sacrificial studs are tapered. In some examples, the first and second sacrificial studs comprise tubes such that the transmitter and the receiver remain exposed in the first and second cavities while the lead frame, the semiconductor die structure, and the wire bonds are encapsulated in the molding compound. In some examples, the first and second sacrificial studs cover the transmitter and receiver, respectively, such that no part of the transmitter and the receiver is exposed.

In some examples, the first and second sacrificial studs comprise metal, and removing the first and second sacrificial studs comprises etching the metal with an etching chemical chosen to etch the metal without damaging the transmitter, the receiver, and the molding compound. In some examples, the first and second sacrificial studs comprise a plastic or photoresist, and removing the first and second sacrificial studs comprises etching the plastic or photoresist without damaging the transmitter, the receiver, and the molding compound. In some examples, the first and second sacrificial studs are glued to the transmitter and the receiver with an adhesive, and are removed using a solvent to remove the adhesive from the transmitter and the receiver. The solvent is chosen to remove the adhesive without damaging the transmitter, the receiver, and the molding compound.

DETAILED DESCRIPTION

The sensor package manufacturing processes described herein include placing sacrificial studs to prevent flow of the molding compound over the transmitter and receiver and to create a local cavity for the transmitter and receiver channels. The sacrificial studs enable massively parallel creation of cavities, as an entire lead frame with a very large number of semiconductor dies can be processed at once. The molding compound forms a barrier between the transmitter and receiver channels, improving channel isolation. The sacrificial studs are then removed to expose the transmitter and the receiver. Thus, the resulting sensor package can be made with standard equipment and manufacturing reliability. Also, a wide variety of sizes and shapes of the cavities for the transmitter and receiver channels can be made with only minor adjustment to the manufacturing process.

Figure 1:
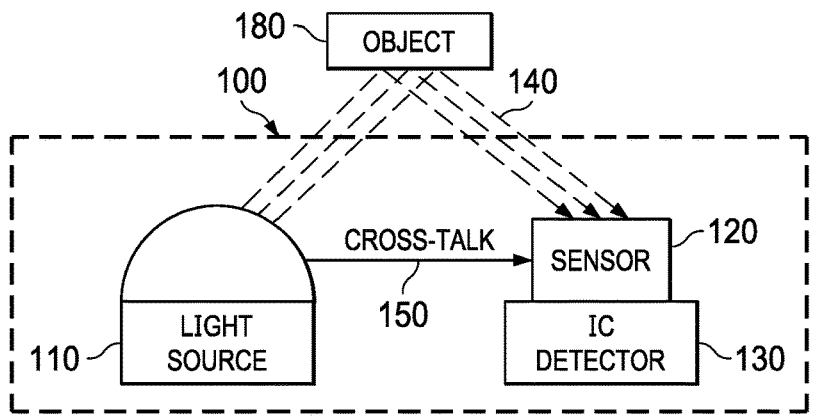
FIG. 1 illustrates an example light detection and ranging (LIDAR) system.

FIG. 1 illustrates an example light detection and ranging (LIDAR) system 100, which includes a light source 110, a sensor 120, and an integrated circuit (IC) 130 including a detector. The light source 110 emits light rays 140 that reflect off an object 180 and are collected by sensor 120. The distance between the LIDAR system 100 and the object 180 can be determined based on the data provided to IC detector 130 from sensor 120. Without a barrier between sensor 120 and light source 110, light rays 150 travel directly from light source 110 to sensor 120 and introduce crosstalk into the sensor data, introducing error into the distance determination. To reduce crosstalk and isolate the light transmitter and light receiver channels, a barrier is often placed between the light source 110 and sensor 120.

However to accurately determine distances, the light source 110 and the sensor 120 must be precisely located relative to each other and remain fixed, so the LIDAR system 100 does not need to perform extensive calibration more than once. To combine the light source 110 and sensor 120 into a single package, two hollow chambers are molded. A semiconductor die with the light source 110 is placed into one chamber, and a semiconductor die with the sensor 120 is placed into the other chamber. Both are wire bonded to the substrates within the chambers. Then the hollow chambers are filled with a transparent mold compound, which covers both semiconductor dies and protects the wire bonding while still allowing light to be emitted and received by the light source 110 and the sensor 120.

The combination of two different mold compounds and substrates with different properties causes manufacture of the two hollow chambers in a single package to be unreliable. To improve the manufacturability, the dies are placed farther apart, and the overall package size increases. While a LIDAR system 100 with a light source 110 and a sensor 120 is described in FIG. 1, any system with a transmitter channel and a receiver channel, such as radar systems and ultrasonic sensing systems, balances similar challenges with channel isolation, calibration, and manufacturing.

Figure 2:
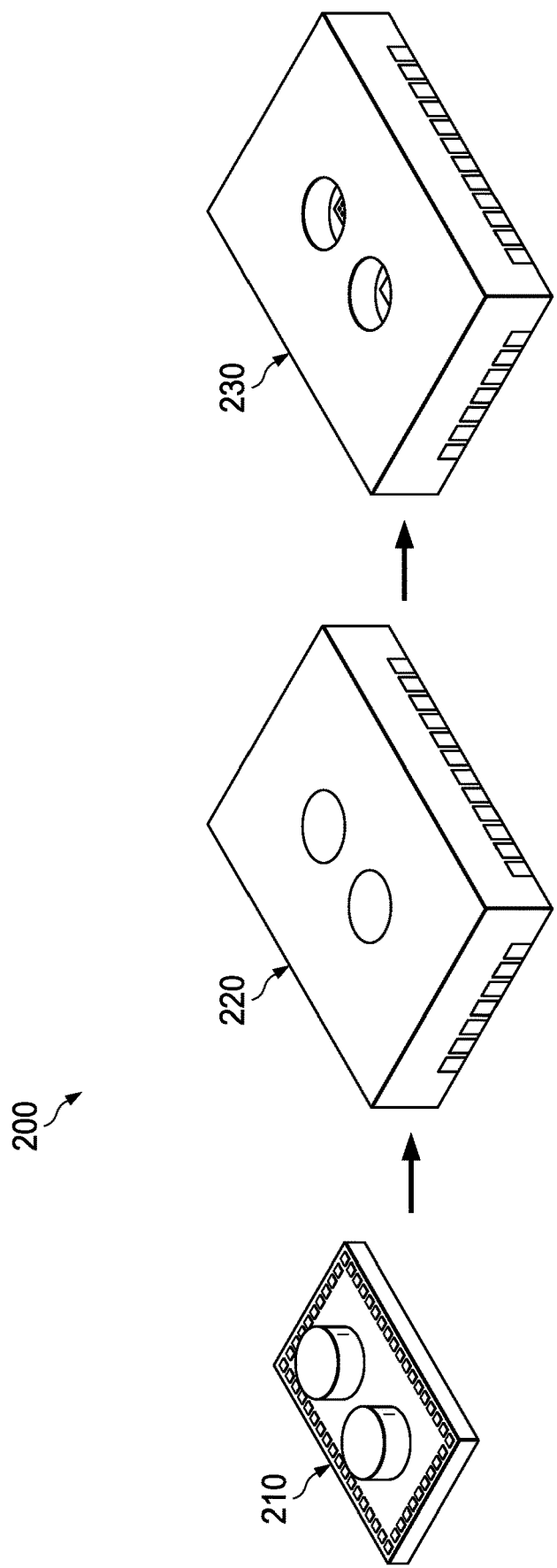
FIG. 2 illustrates an example overview of a sensor package molding process.

FIG. 2 illustrates an example overview of a sensor package molding process 200. Rather than separating the transmitter and the receiver onto different semiconductor dies, they are placed together on the same semiconductor die structure 210 in the desired configuration and proximity to each other. Sacrificial studs are placed over the transmitter and receiver to protect them during the next step of the molding process 200 and to create clear transmitter and receiver channels. The semiconductor die structure 210 is then encapsulated in a single standard molding compound but the sacrificial studs are left exposed, as shown in semiconductor 220. The sacrificial studs can be removed to expose the transmitter and receiver while maintaining a barrier of the molding compound between the two and ensuring channel isolation, resulting in the semiconductor die 230.

Figure 3A:
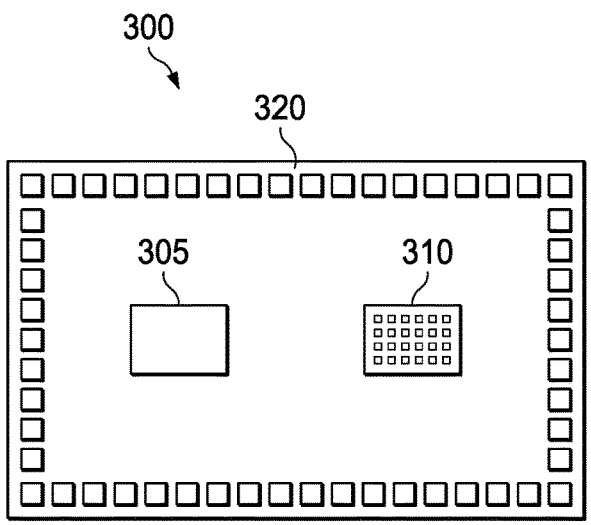
FIGS. 3A-H illustrate an example fabrication process for a sensor package molding.
Figure 3B:
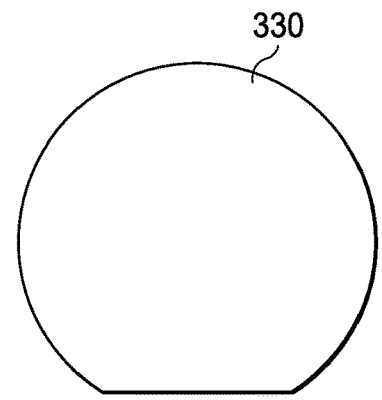
Figure 3C:
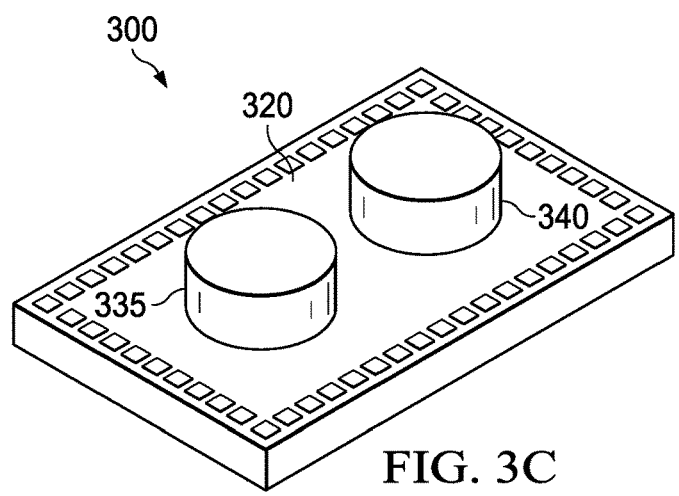

FIGS. 3A-H illustrate an example fabrication process for a sensor package molding. FIG. 3A illustrates an example semiconductor die 300 including a transmitter 305 and a receiver 310 affixed on a die 320. The transmitter 305 and receiver 310 are arranged on a die 320 in a desired configuration based on the intended implementation for the sensor package. The desired configuration can be chosen to simplify calibration procedures, increase the number of channels in an area on the die 320, or the like. FIG. 3B illustrates an example wafer 330 with multiple dies 320 fabricated together. Next, sacrificial studs 335 and 340 are placed over transmitter 305 and receiver 310, as illustrated in the angled view of semiconductor die 300 shown in FIG. 3C.

Figure 5:
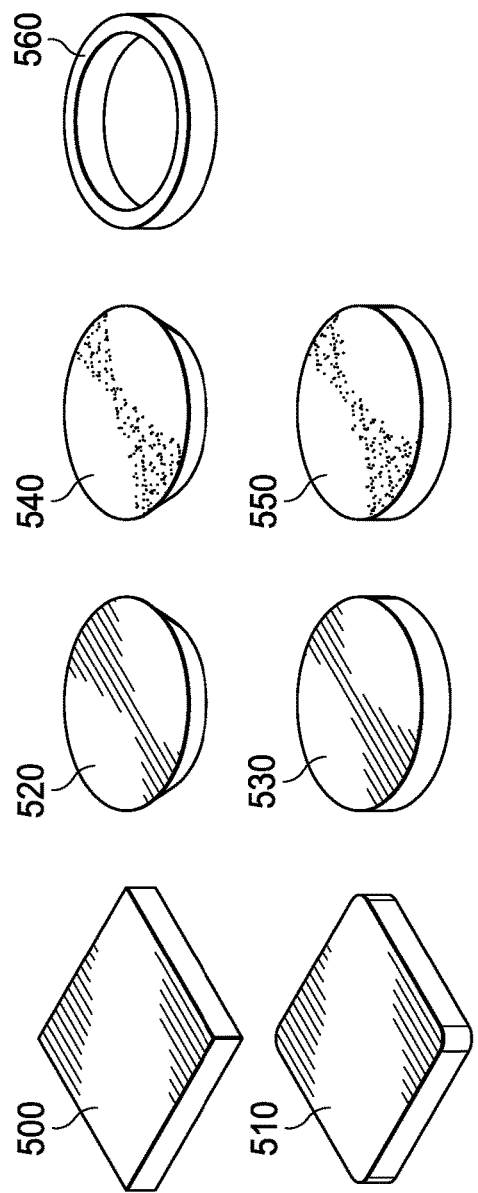
FIG. 5 illustrates example shapes of sacrificial studs used in fabricating a sensor package molding.

Sacrificial studs 335 and 340 are cylindrical shaped in this example, but may be hollow rings encircling transmitter 305 and receiver 310, or other shapes as shown in FIG. 5. Sacrificial studs 335 and 340 can be made of metal, plastic, photoresist, or other appropriate materials and fastened to semiconductor die 300 by an adhesive material, surface mount technology, or the like. The sacrificial studs can be fabricated using standard mold tooling, equipment, materials, and processes without resorting to special mold tooling or inserts. Also, the sacrificial studs can be created in parallel for each semiconductor die on wafer 330 such that the manufacturing process is not unduly slowed by the step of creating the sacrificial studs.

Figure 3D:
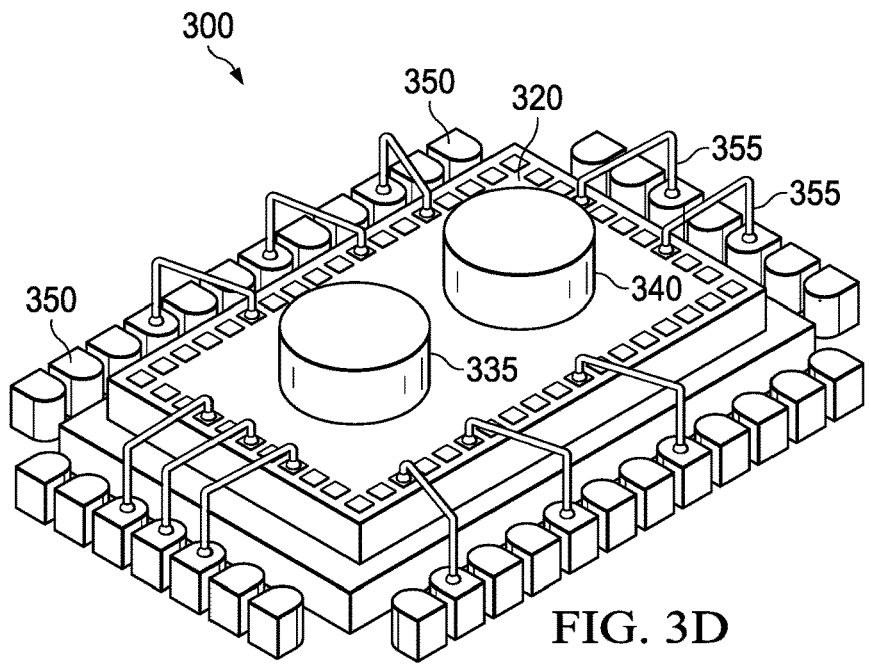
Figure 3E:
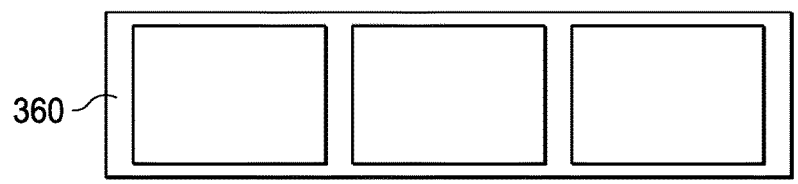

The semiconductor die 300 is separated from the larger wafer 330 by a diamond saw, a laser, or other process, and attached to a lead frame 350 and wire bonded 355, as shown in the closeup in FIG. 3D. FIG. 3E illustrates the larger array 360 of multiple semiconductor dies 300 attached to the lead frame 350. In some manufacturing processes, the sacrificial studs 335 and 340 can be placed after semiconductor die 300 is attached to the lead frame 350 and wire bonded 355. In some implementations, stress buffers and coatings such as polyimide, polybenzoxazole, and silicone coatings can be applied.

Figure 3F:
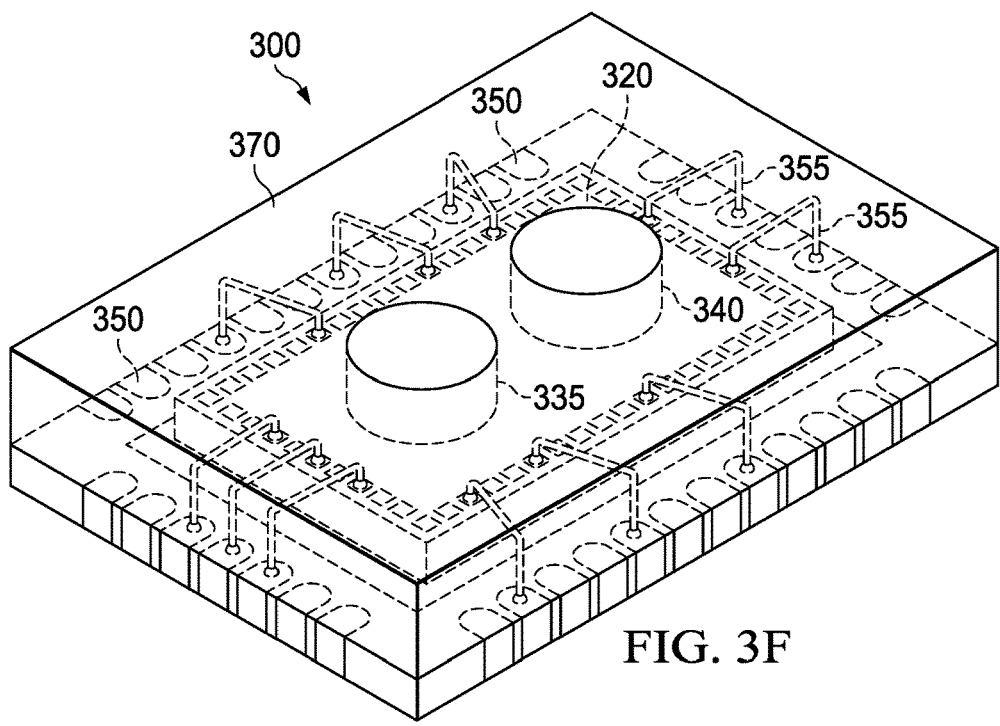

FIG. 3F shows an x-ray view of the single semiconductor 300 after it has been encapsulated in a molding compound 370 such as plastic or epoxy. The sacrificial studs 335 and 340 act as barriers for mold flow and create a local cavity without the molding compound 370. The sacrificial studs 335 and 340 are removed next, such as by chemical etching for metallic studs or light exposure for photoresist studs. A solvent can remove any remaining adhesive as needed. The material of sacrificial studs 335 and 340, molding compound 370, transmitter 305 and receiver 310, and the removal materials are chosen to ensure that the sacrificial studs 335 and 340 can be removed without damaging transmitter 305 and receiver 310 and leaving the molding compound intact.

Figure 3G:
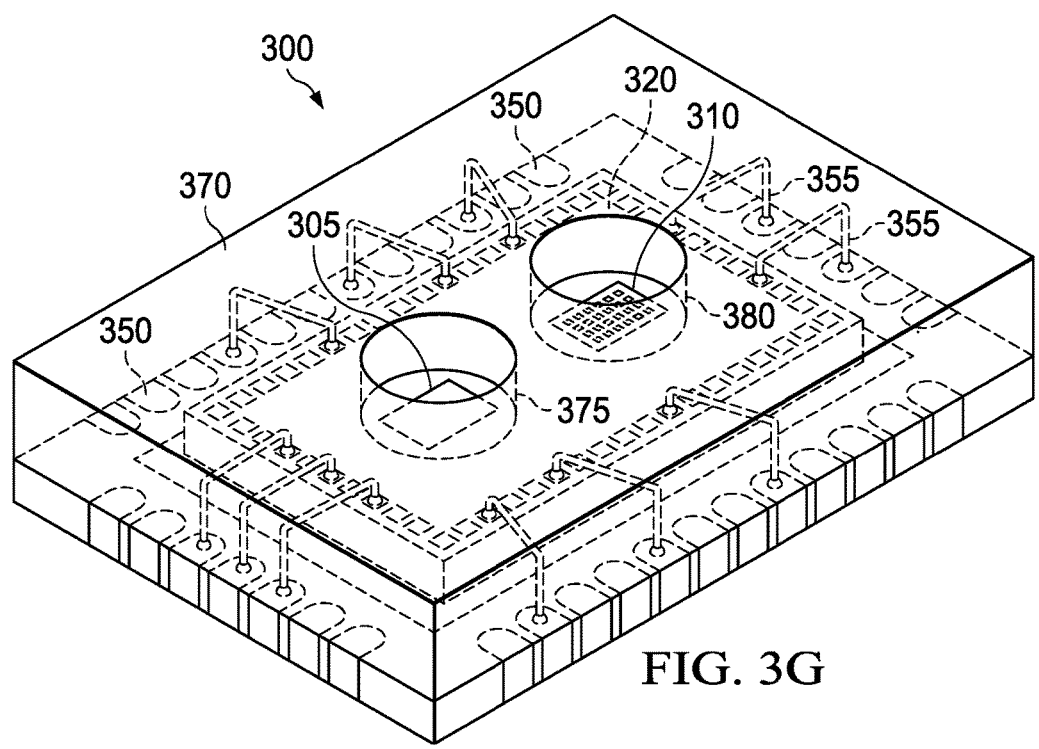

FIG. 3G shows an x-ray view of the semiconductor die 300 with sacrificial studs 335 and 340 removed, leaving behind cavities 375 and 380, respectively, and exposing transmitter 305 and receiver 310. The cavities 375 and 380 allow transmitter 305 and receiver 310 to transmit and receive signals while a barrier of the molding compound 370 between transmitter 305 and receiver 310 ensures channel isolation between the two. The cavities 375 and 380 can be left empty or filled with a transparent plastic or other material that allows signals to be emitted and received unimpaired. In some implementations, lenses or other optical components can be aligned with the cavities 375 and 380.

Figure 3H:
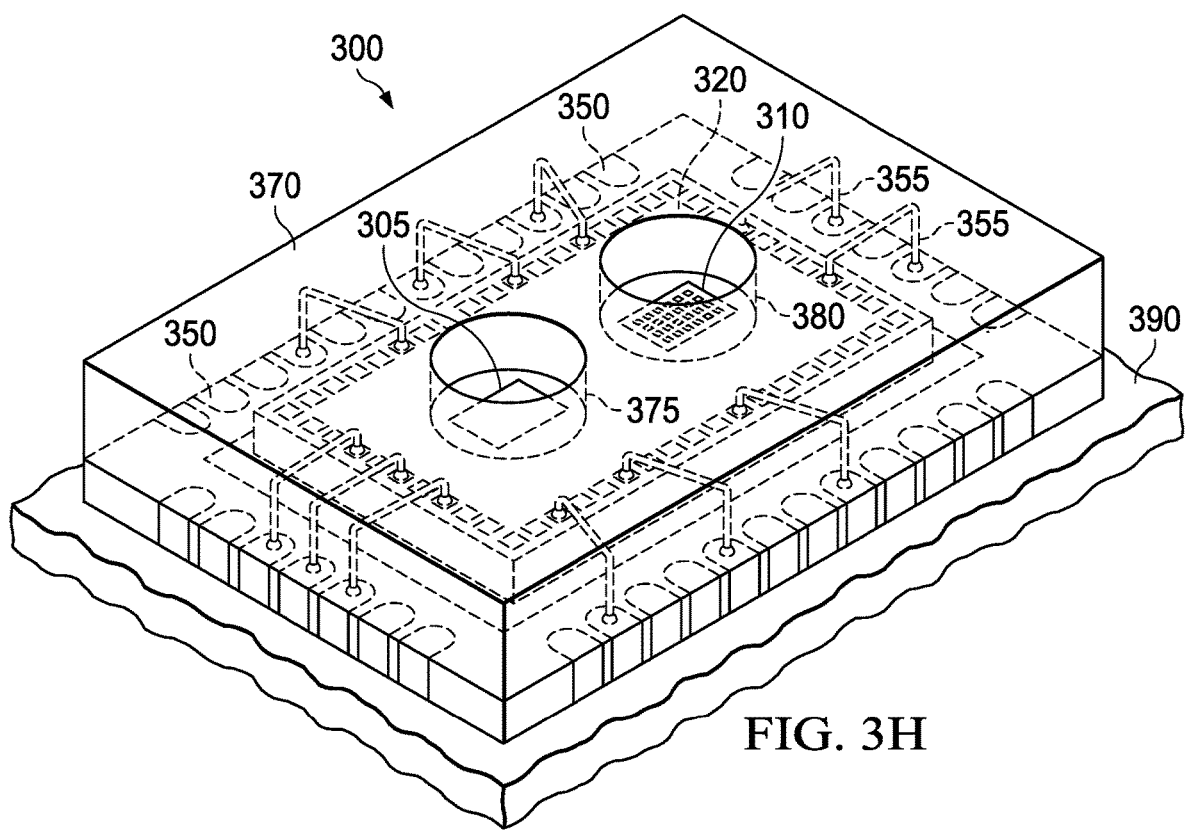

The individual packages can be separated from the lead frame 350 and calibrated for use, such as for use in a proximity sensor. Because the transmitter 305 and receiver 310 are fixed relative to each other, calibration can be performed less frequently and more simply than in other systems in which the transmitter 305 and receiver 310 are on separate semiconductor die and can move relative to each other. The semiconductor die 300 as packaged is attached to a printed circuit board 390 and integrated into a larger system, as shown in FIG. 3H. For example, the semiconductor die 300 is incorporated into a proximity sensor or a LIDAR system 100, shown in FIG. 1.

Figure 4:
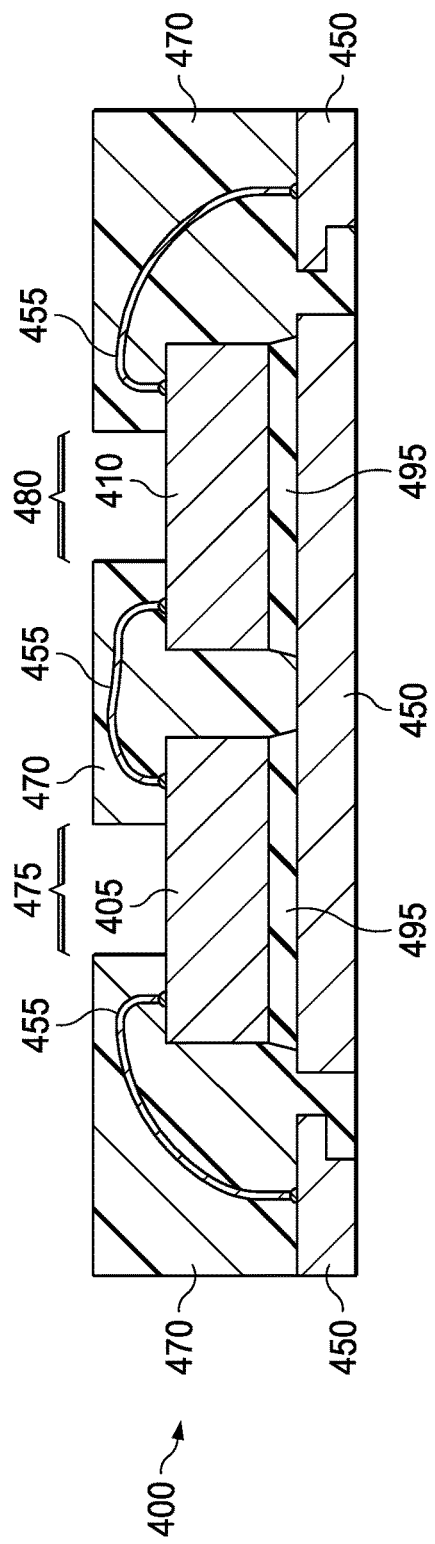
FIG. 4 illustrates an example sensor package molding with a multi-chip module.

FIG. 4 illustrates an example sensor package 400 with a multi-chip module. In some implementations, the desired substrate characteristics for the transmitter and the desired substrate characteristics for the receiver are incompatible, such that the transmitter and the receiver are placed on separate semiconductor die with different characteristics. The separate semiconductor die are included in a single semiconductor die structure. The transmitter die 405 and the receiver die 410 can be packaged as a multi-chip module according to the process outlined in FIGS. 3A-H. Transmitter die 405 and receiver die 410 are fastened to a lead frame 450 by an adhesive 495 and wire bonded 455 together and to the lead frame 450.

The semiconductor die structure including the two dies 405 and 410 and the wire bonds 455 are encapsulated in molding compound 470, although cavities 475 and 480 remain open and create isolated channels for transmitter die 405 and receiver die 410. Although the relative positions of transmitter die 405 and receiver die 410 will not be as precise as the transmitter 305 and receiver 310 on a single semiconductor die 300, calibration of sensor package 400 can be done easily and once after manufacturing and performed rarely after that initial calibration.

FIG. 5 illustrates example shapes of sacrificial studs 500-560 used in fabricating a sensor package molding. The sacrificial studs can be square-shaped, as illustrated by stud 500 with pointed corners and stud 510 with rounded corners. Studs 520 and 540 are circular-shaped with tapered sides, such that the top surface of the studs is larger than the bottom surface. Similarly, studs 530 and 550 are cylindrical, with flat sides and substantially equal-sized top and bottom surfaces. Studs 520 and 540 and studs 530 and 550 are similarly shaped but made of different materials, such as metal and photoresist, respectively. While these example studs are solid, the sacrificial studs 500-550 can also be hollow rings, such as stud 560.

Modifications are possible in the described embodiments, and other embodiments are possible, within the scope of the claims.

What is claimed is:

1. A method, comprising: forming a first structure on a first circuit; forming a second structure on a second circuit; encapsulating the first and second circuits and at least a part of the first and second structures with a molding compound; removing the first structure from the molding compound to form a first cavity over the first circuit; removing the second structure from the molding compound to form a second cavity over the second circuit; and forming a second material different from the molding compound in at least part of one of the first and second cavities.

2. The method of claim 1, wherein the first circuit is on a first semiconductor die, the second circuit is on a second semiconductor die, and encapsulating the first and second circuits includes encapsulating the first and second semiconductor dies.

3. The method of claim 1, wherein the molding compound is a first molding compound, and the second material includes a second molding compound.

4. The method of claim 1, wherein the first circuit includes a light transmitter, the second circuit includes a light receiver, and the second material transmits light.

5. The method of claim 1, wherein the molding compound provides a barrier between the first and second cavities.

6. The method of claim 1, each of the first and second structures includes a respective tapered stud.

7. The method of claim 1, wherein each of the first and second structures has a respective polygon shape or a respective circular shape.

8. The method of claim 1, wherein each of the first and second structures includes a metal, and the first and second structures are removed with etching.

9. The method of claim 1, wherein each of the first and second structures includes a plastic or photoresist, and the first and second structures are removed by a solvent.

10. The method of claim 1, further comprising:
affixing the first structure on the first circuit with a first adhesive;
affixing the second structure on the second circuit with a second adhesive;
removing the first adhesive with a first solvent; and
removing the second adhesive with a second solvent.

11. The method of claim 1, wherein the first structure covers the first circuit entirely, and the second structure covers the second circuit entirely.

12. The method of claim 1, wherein each of the first and second structures includes a respective ring.

13. The method of claim 1, wherein each of the first and second structures includes a respective cylindrical stud.

14. The method of claim 1, further comprising:
attaching one or more semiconductor dies including the first and second circuits on a lead frame; and
forming electrical connections between the first and second circuits and the lead frame,
wherein encapsulating the first and second circuits with a molding compound includes encapsulating the one or more semiconductor dies, the lead frame, and the electrical connections with the molding compound.

* * * * *